United States Patent
Ates (10) Patent No.: US 12,422,783 B2
(45) Date of Patent: Sep. 23, 2025

(54) DTC BIASING SCHEME FOR TEMPERATURE COMPENSATION

(71) Applicant: Qorvo US, Inc., Utrecht (NL)

(72) Inventor: Erdogan Ozgur Ates, Maarssen (NL)

(73) Assignee: Qorvo US, Inc., Greensboro, NC (US)

( * ) Notice: Subject to any disclaimer, the term of this patent is extended or adjusted under 35 U.S.C. 154(b) by 224 days.

(21) Appl. No.: 18/207,933

(22) Filed: Jun. 9, 2023

(65) Prior Publication Data

US 2023/0418236 A1 Dec. 28, 2023

Related U.S. Application Data (60) Provisional application No. 63/356,080, filed on Jun. 28, 2022.

(51) Int. Cl.
G04F 10/00 (2006.01)
H03M 1/48 (2006.01)
H03M 1/50 (2006.01)

(52) U.S. Cl.
CPC .......... G04F 10/005 (2013.01); H03M 1/48 (2013.01); H03M 1/50 (2013.01)

(58) Field of Classification Search
CPC ............ H03M 1/50; H03M 1/60; G04F 1/005
USPC ........................................................ 341/144
See application file for complete search history.

(56) References Cited

U.S. PATENT DOCUMENTS

| | | | | |
|---|---|---|---|---|
| 8,098,083 | B2 * | 1/2012 | Truong | H03K 5/15006 326/82 |
| 9,806,759 | B1 * | 10/2017 | Sievert | G05F 1/613 |
| 2007/0133653 | A1 * | 6/2007 | Lee | G01N 25/20 374/10 |
| 2013/0099842 | A1 * | 4/2013 | Kuo | H03H 11/26 327/261 |
| 2014/0133529 | A1 * | 5/2014 | Ding | H04L 25/03885 375/219 |
| 2021/0221128 | A1 * | 7/2021 | Gardner | B41J 2/04573 |

OTHER PUBLICATIONS

Markulic, N. et al., "A DTC-Based Subsampling PLL Capable of Self-Calibrated Fractional Synthesis and Two-Point Modulation," IEEE Journal of Solid-State Circuits, vol. 51, No. 12, Dec. 2016, IEEE, pp. 3078-3092.

Mercandelli, M. et al., "A 12.5-GHz Fractional-N Type-I Sampling PLL Achieving 58-fs Integrated Jitter," IEEE Journal of Solid-State Circuits, vol. 57, No. 2, Feb. 2022, IEEE, pp. 505-517.

Wu, W. et al., "A 28-nm 75-fsrms Analog Fractional-N Sampling PLL With a Highly Linear DTC Incorporating Background DTC Gain Calibration and Reference Clock Duty Cycle Correction," IEEE Journal of Solid-State Circuits, vol. 54, No. 5, May 2019, IEEE, pp. 1254-1265.

\* cited by examiner

*Primary Examiner* — Peguy Jean Pierre
(74) *Attorney, Agent, or Firm* — Withrow & Terranova, P.L.L.C.

(57) ABSTRACT

A digital-to-time converter (DTC) is disclosed. In some embodiments, the DTC includes a bias circuit, a delay circuit, and a replica. The delay circuit is operably connected to the bias circuit. Furthermore, a replica circuit is operably connected to the bias circuit, wherein the bias circuit is operable to output a supply signal for the delay circuit and the replica circuit that has a negative slope with respect to a signal level of the supply signal and temperature.

19 Claims, 5 Drawing Sheets

DTC BIASING SCHEME FOR TEMPERATURE COMPENSATION

RELATED APPLICATIONS

This application claims the benefit of provisional patent application Ser. No. 63/356,080, filed Jun. 28, 2022, the disclosure of which is hereby incorporated herein by reference in its entirety.

FIELD OF THE DISCLOSURE

The present disclosure relates generally to digital-to-time converters (DTCs), and more particularly to a biasing scheme for temperature compensation in DTCs.

BACKGROUND

Digital-To-Time Converters (DTC) create a time-delayed version of an input signal, such as an input clock signal. DTCs are used in a variety of applications and circuits. For example, DTCs are used in sub-sampling fractional digital phase locked loop (PLL) circuits and provide a mixing of the radio frequency (RF) to non-integer division frequencies. DTCs can be also used to increase the phase resolution of the phase lock and provide a two-point injection modulation compensation path.

One type of a DTC is a switched capacitor DTC. However, switch capacitor DTCs are noisy and do not compensate for a temperature dependency of the DTC total delay range. Capacitance values increase with temperature, which means an overall DTC full-scale delay range increases with temperature. An increase in the full-scale delay range can result in a PLL circuit losing the lock, which may cause the PLL circuit to stop operating properly.

Other types of DTCs are resistor-capacitor (RC) DTCs. RC DTCs are less sensitive to transistor noise. Also, RC DTCs do not compensate for the temperature dependency of the DTC total delay range. Resistance and capacitance values increase with temperature, and the increased resistance and capacitance values produce an increase in the overall DTC full-scale delay range. An increased full-scale delay range may result in performance issues in a PLL circuit, as output spur levels increase and system performance is degraded.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
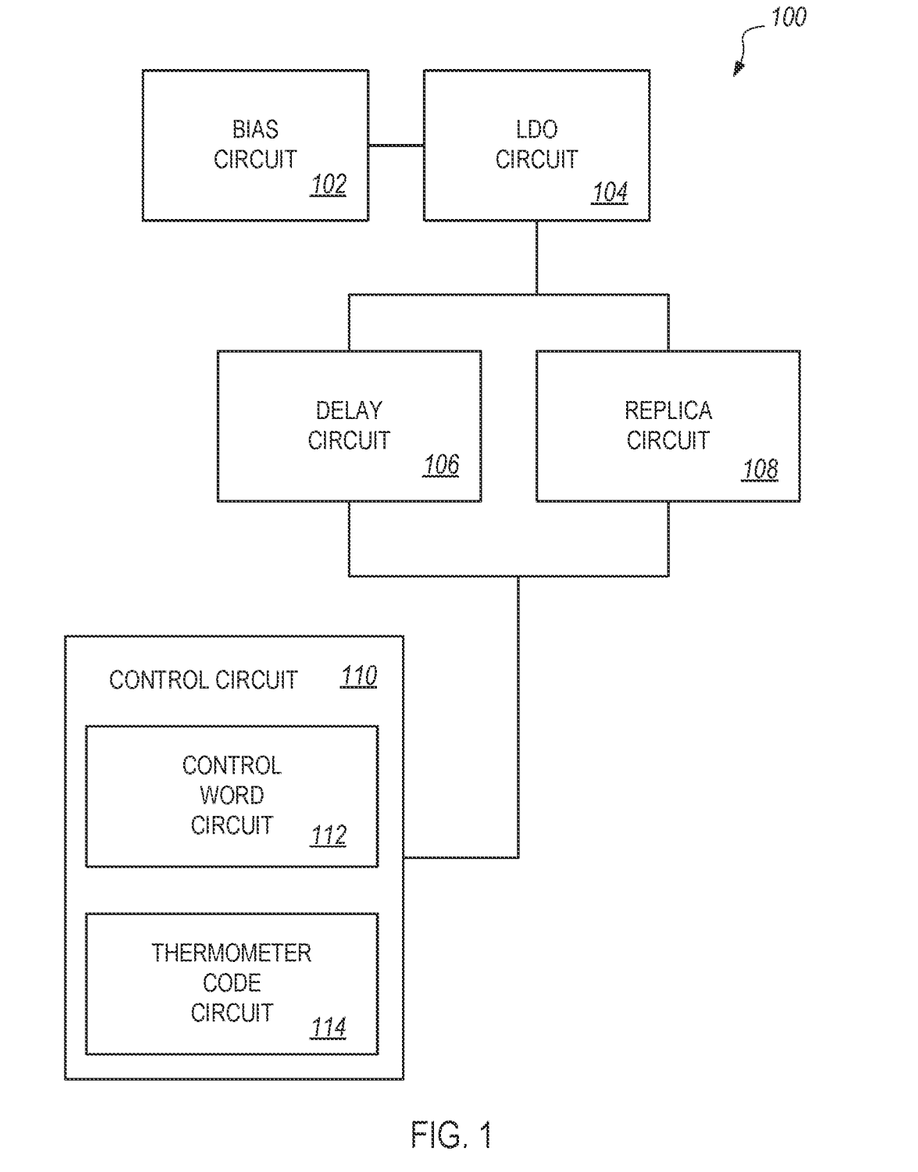
FIG. 1 illustrates a block diagram of a digital-to-time converter (DTC) system according to embodiments of the disclosure.

FIG. 1 illustrates a block diagram of a digital-to-time converter (DTC) system 100 according to embodiments of the disclosure. The DTC system 100 includes a bias circuit 102 operably connected to an input of a low dropout regulator (LDO) circuit 104. The bias circuit 102 outputs a reference signal (e.g., a reference voltage) that has CTAT (Complementary-To-Absolute-Temperature) behavior. The LDO circuit 104 receives the reference signal and buffers the reference signal. The LDO circuit 104 is operable to output a supply signal (e.g., a supply voltage signal) that is used as the supply signal for a delay circuit 106 and to a replica circuit 108.

The supply signal is input into the delay circuit 106 and into the replica circuit 108. The delay circuit 106 generates time delays for an input signal (e.g., an input clock signal). Based on control codes that are used to adjust the time delays (e.g., the delay steps), a capacitance of a programmable capacitor array in the delay circuit 106 can change during operation of the system 100. A complimentary control code is applied to the replica circuit 108 in order to present a constant capacitive load to the LDO circuit 104. The replica circuit 108 reduces or eliminates ripples in the supply signal.

A control circuit 110 is operably connected to the delay circuit 106 and the replica circuit 108. The control circuit 110 is configured to generate the control codes that are used to adjust the time delay produced by the delay circuit 106. As discussed earlier, the control codes are used to change the capacitance of the programmable capacitor array in the delay circuit 106.

In certain embodiments, the control circuit 110 includes a control word circuit 112 and a thermometer code circuit 114. The control word circuit 112 is operable to generate the control codes, where one or more bits in each control word are used to adjust the time delay produced by the delay circuit 106. Thus, the control word circuit 112 provides digital control of the DTC system 100.

The thermometer code circuit 114 is operable to receive one or more bits in a control word (e.g., the most significant bit (MSB)) and convert the bit(s) into one or more thermometer codes. As will be described in more detail later, the one or more thermometer codes, along with the one or more bits in the control codes, are used to adjust the time delay produced by the DTC delay circuit 106. Thus, the thermometer circuit 114 also provides digital control of the DTC system 100. In other embodiments, the DTC control circuit 110 may include additional or different circuits. For example, the thermometer code circuit 114 can be omitted.

Figure 2:
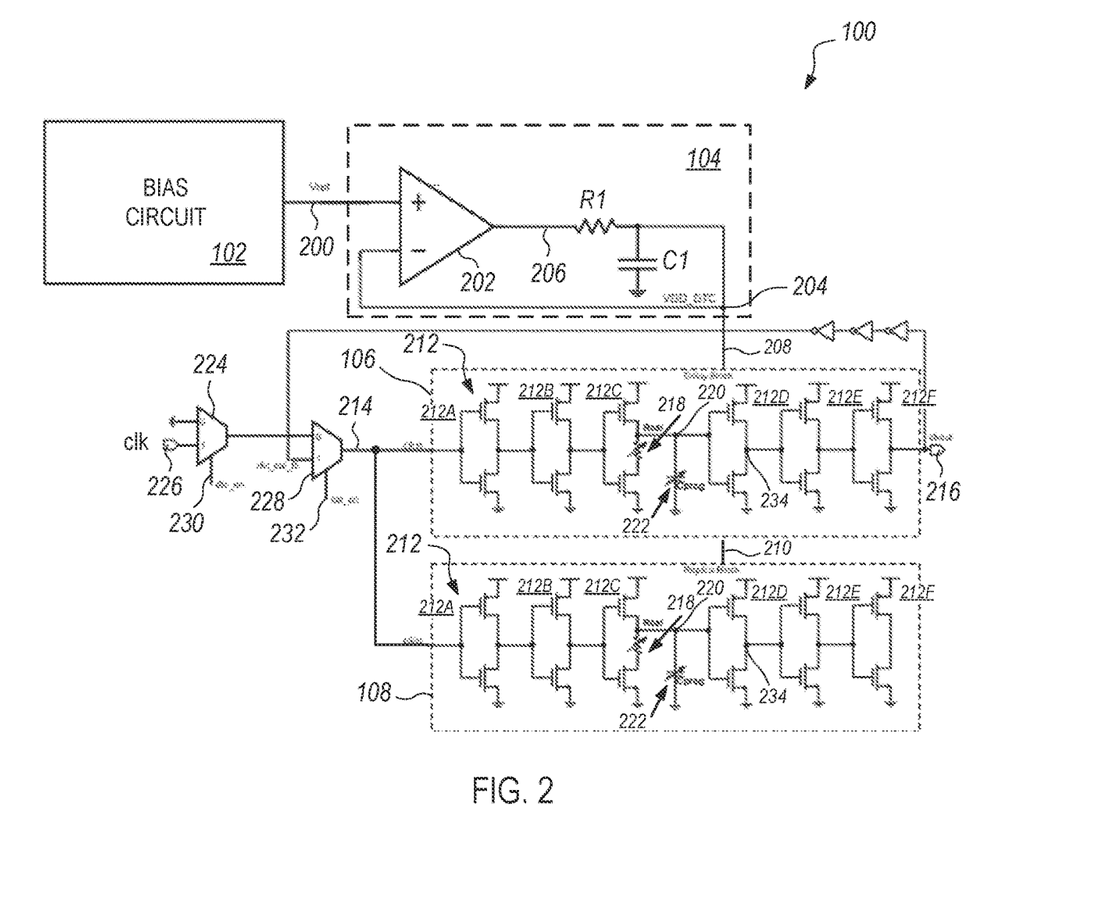
FIG. 2 illustrates a circuit diagram of a portion of the DTC system shown in FIG. 1 according to embodiments of the disclosure.

FIG. 2 illustrates a circuit diagram of a portion of the DTC system 100 shown in FIG. 1 according to embodiments of the disclosure. An output of the bias circuit 102 is operably connected to an input of the LDO circuit 104. The bias circuit 102 outputs a reference signal Vref (e.g., a reference voltage) on signal line 200 that is received by the LDO circuit 104. As will be described in more detail later, the reference signal Vref is used to compensate for the temperature dependency of the DTC full-scale delay range. The example bias circuit 102 is described in more detail in conjunction with FIG. 3.

The example LDO circuit 104 includes an amplifier 202 that receives Vref at a first input on the signal line 200. An output of the amplifier 202 is operably connected to an input of a resistor R1. An output of R1 is operably connected to a capacitor C1. The output of R1 and a second input of the amplifier 202 are also operably connected to node 204. The LDO circuit 104 buffers Vref and outputs an output signal on signal line 206. The R1 and the C1 filter the output signal to provide a clean supply signal Vdd_dtc at the node 204. In a non-limiting nonexclusive example, the resistance value of R1 is six hundred (600) ohms and a capacitance value of C1 is thirty (30) picofarads (pF).

The supply signal Vdd_dtc is input into the delay circuit 106 on signal line 208. The supply signal Vdd_dtc is also input into the replica circuit 108 on signal line 210. The replica circuit 108 is a replica of the delay circuit 106. The replica circuit 108 includes the same components and layout of the components as in the delay circuit 106. The only difference between the delay circuit 106 and the replica circuit 108 is that the control word applied to the delay circuit106 is applied inverted to the replica circuit 108. As described earlier, the replica circuit 108 is used to reduce or eliminate ripples in the supply signal.

The example delay circuit 106 includes multiple inverters 212 operably connected in series. Each inverter 212 includes a p-type transistor (e.g., p-type metal-oxide-semiconductor transistor (PMOS)) operably connected in series with an n-type transistor (e.g., n-type metal-oxide-semiconductor transistor (NMOS)). In the illustrated delay circuit 106, six (6) inverters 212A, 2128, 212C, 212D, 212E, 212F are connected in series. Other embodiments can include any number of inverters 212.

A clock input signal (clkin) is received at an input of the inverter 212A on signal line 214. An output of the inverter 212A is operably connected to an input of the inverter 2128. An output of the inverter 2128 is operably connected to an input of the inverter 212C. An output of the inverter 212C is operably connected to an input of the inverter 212D. An output of the inverter 212D is operably connected to an input of the inverter 212E. An output of the inverter 212E is operably connected to an input of the inverter 212F. A clock output signal (clkout) is output from an output of the inverter 212F on signal line 216. The clock output signal is time delayed with respect to the clock input signal.

A programmable resistor 218 (Rcal) is operably connected between the output of the inverter 212C (node 220) and a terminal of the n-type transistor in the inverter 212C. The full-scale delay range is programmable by changing the value of the Rcal 218. A programmable capacitor 222 (Cprog) is operably connected to the output of the inverter 212C (node 220) and ground. In certain embodiments, the Cprog 222 is implemented as a programmable switch-capacitor array. One example of programmable switch-capacitor array is described in more detail in conjunction with FIG. 7.

A first input of a first switch 224 receives the clock signal (clk) on signal line 226. A second input of the first switch 224 is operably connected to ground. An output of the first switch 224 is operably connected to a first input of a second switch 228. A second input of the second switch 228 is operably connected to the signal line 216. An output of the second switch 228 is operably connected to the input of the inverter 212A via the signal line 214. In certain embodiments, the first switch 224 is operable to enable and disable the DTC system 100. A select signal (dtc_en) is received by the first switch 224 on signal line 230. Based on a signal level of the select signal, the first input or the second input of the first switch 224 is selected. The first input is selected to operate the DTC system 100. The second input (the ground input) is selected to disable the DTC system 100.

The second switch 228 is used to enable a calibration mode of the DTC system 100. A select signal (cal_en) is received by the second switch 228 on signal line 232. The first input of the second switch 228 is selected to operate the DTC system 100 in a non-calibration mode (e.g., an operating mode). The second input of the second switch 228 is selected to operate the DTC system 100 in the calibration mode. In FIG. 2, the first switch 224 and the second switch 228 are shown as multiplexers, but other embodiments are not limited to this configuration. The first switch 224 and the second switch 228 may be implemented with any suitable type of switch.

The delay (τ) of the DTC system 100 can be determined by Equation 1. A value of the programmable resistor 218 (Rcal) and a value of the programmable capacitor 222 (Cprog) are selected and used in Equation 1.

$$\tau = -R_{cal}C_{prog}\ln\left(\frac{V_{inv,th}}{V_{DD}}\right) \cong -R_{cal}C_{prog}\ln(0.5) = 0.7 \text{ RC}, \quad \text{Equation 1}$$

where $V_{inv,th}$ represents a threshold voltage of the inverter 212D and Vdd represents the voltage of the supply signal at the node 204. The delay (τ) is the time needed to discharge the node 220 from Vdd to the threshold voltage of the inverter 212D.

Figure 3:
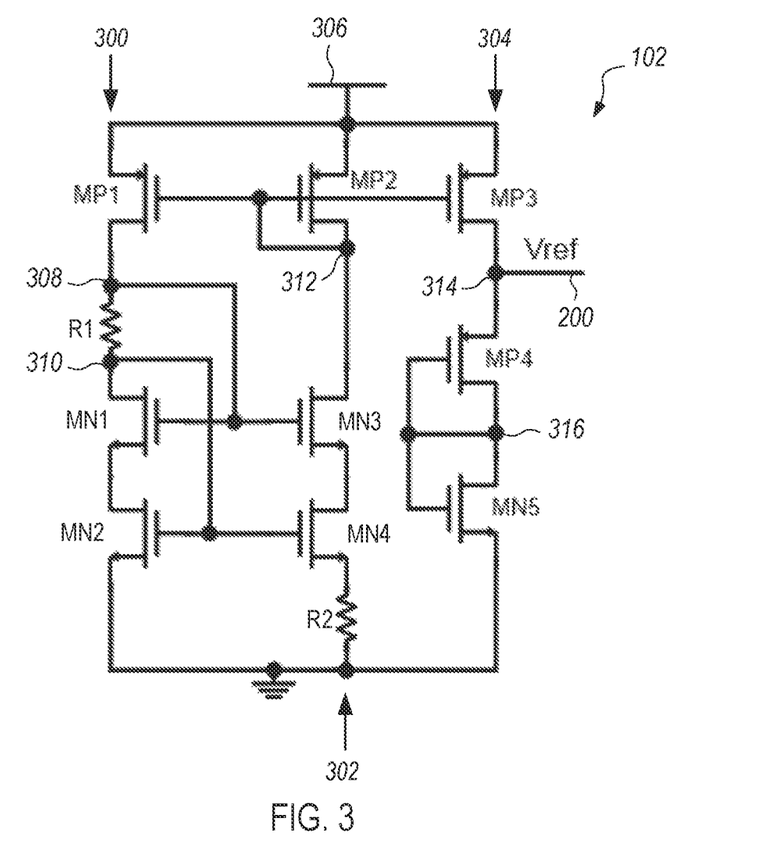
FIG. 3 illustrates a circuit diagram of an example DTC bias circuit shown in FIG. 1 and FIG. 2 according to embodiments of the disclosure.

The bias circuit 102 is used to compensate the temperature dependency of the DTC full-scale delay range. FIG. 3 illustrates a circuit diagram of the example bias circuit 102 shown in FIG. 1 and FIG. 2 according to embodiments of the disclosure. The example bias circuit 102 includes a first circuit path 300, a second circuit path 302, and a third circuit path 304 operably connected in parallel between an input node 306 and ground. The first circuit path 300 includes a first terminal of a first p-type transistor MP1 operably connected to the input node 306 and a second terminal of MP1 operably connected to a first node 308. A first resistor R1 is operably connected between the first node 308 and a second node 310. A first terminal of a first n-type transistor MN1 is operably connected to the second node 310 and a second terminal of MN1 is operably connected to a first terminal of a second n-type transistor MN2. A second terminal of MN2 is operably connected to ground.

The second circuit path 302 includes a first terminal of a second p-type transistor MP2 operably connected to the input node 306 and a second terminal of MP2 operably connected to a third node 312. A first terminal of a third n-type transistor MN3 is operably connected to the third node 312 and a second terminal of MN3 is operably connected to a first terminal of a fourth n-type transistor MN4. A second terminal of MN4 is operably connected to a first terminal of a second resistor R2. A second terminal of R2 is operably connected to ground.

The third circuit path 304 includes a first terminal of a third p-type transistor MP3 operably connected to the input node 306 and a second terminal of MP3 operably connected to an output node 314. The output node 314 is operably connected to the signal line 200 (FIG. 2). A first terminal of a fourth p-type transistor MP4 is operably connected to the output node 314 and a second terminal of MP4 is operably connected to a fourth node 316. A first terminal of a fifth n-type transistor MN5 is operably connected to the fourth node 316 and a second terminal of MN5 is operably connected to ground.

A gate of MP1 in the first circuit path 300 is operably connected to a gate of MP2 in the second circuit path 302 and to a gate of MP3 in the third circuit path 304. The gate of MP1 and the gate of MP2 are also operably connected to the third node 312. A gate of MN1 in the first circuit path 300 is operably connected to the first node 308 in the first circuit path 300. The gate of MN1 is also operably connected to a gate of MN3 in the second circuit path 302. A gate of MN2 in the first circuit path 300 is operably connected to the second node 310 in the first circuit path 300. The gate of MN2 is also operably connected to a gate of MN4 in the second circuit path 302. A gate of MP4 in the third circuit path 304 is operably connected to a gate of MN5 in the third circuit path 304. The gate of MP4 and the gate of MP5 are also operably connected to the fourth node 316 in the third circuit path 304.

A threshold voltage of MP4 in the third circuit path 304 and a threshold voltage of MN5 in the third circuit path 304 vary inversely with respect to temperature. As the temperature increases, the threshold voltage of MP4 and the threshold voltage of MN5 both decrease. As the temperature decreases, the threshold voltage of MP4 and the threshold voltage of MN5 both increase. Due to this inverse relationship between the temperature and the threshold voltages of MP4 and MN5, a signal level (e.g., voltage level) of the reference signal Vref has an inverse relationship with respect to temperature. As the temperature increases, the signal level (e.g., the voltage level) of Vref decreases. As the temperature decreases, the signal level of Vref increases. Accordingly, Vref is a complementary-to-absolute temperature (CTAT) regulated signal. The CTAT behavior of Vref is due to negative temperature coefficients of MP4 and MN5 threshold voltages. The variations in the threshold voltage of MP4 and the variations in the threshold voltage of MN5 produce the CTAT behavior in Vref.

Figure 4:
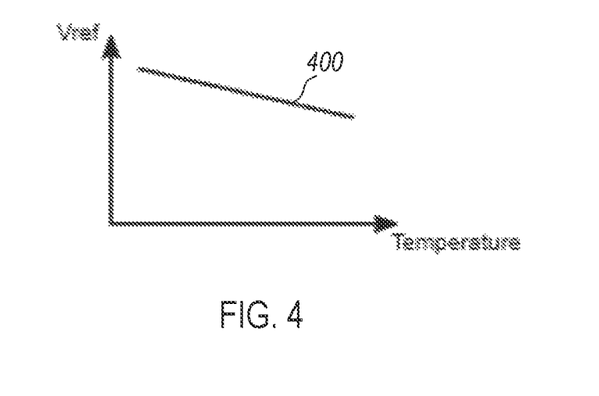
FIG. 4 illustrates an example plot of a reference voltage to temperature according to embodiments of the disclosure.

FIG. 4 illustrates an example plot 400 of the reference signal Vref versus temperature according to embodiments of the disclosure. As shown in FIG. 4, the signal level (e.g., voltage level) of the reference signal Vref has an inverse relationship with respect to temperature. The plot 400 depicts an example plot for a DTC system. As the temperature increases, the voltage level of Vref decreases. As the temperature decreases, the voltage level of Vref increases. Accordingly, the plot 400 has a negative slope. As will be described in more detail later, the negative slope of Vref assists in compensating for the temperature dependency of the full-scale delay range of the DTC system.

In FIG. 2, both the Rcal 218 and the Cprog 222 have positive temperature coefficients. Hence, the RC delay produced by Rcal 218 and Cprog 222 increases with temperature, which in turn causes the DTC full-scale delay range to increase with temperature. The temperature dependency of the DTC delay range is compensated for in part by adjusting an input slope dependent delay of the inverter 212D. The inverter 212D contributes to the total delay because the delay changes with each control code. When the slope is more negative (e.g., a higher slope), the node 220 discharges more quickly which means there is less delay on the inverter 212D. When the slope is less negative (e.g., a lower slope), the node 220 discharges more slowly which means there is more delay on the inverter 212D. In some instances, the delay of the inverter 212D is not constant and depends on the slew rate of the node 220.

When the temperature increases, the signal level of the supply signal is decreasing and the node 220 discharges in same amount of time. Accordingly, the p-type transistor in the inverter 212D charges the output node to a lower voltage level, which in turn reduces the delay. When the temperature is decreasing, the signal level of the supply signal is increasing and the inverter 212D needs a greater amount of time to increase the signal level (e.g., the voltage) on the output node 234. Accordingly, the delay increases. In this manner, the temperature dependency of the DTC full-scale delay range is compensated and the full-scale delay range is more stable.

Figure 5:
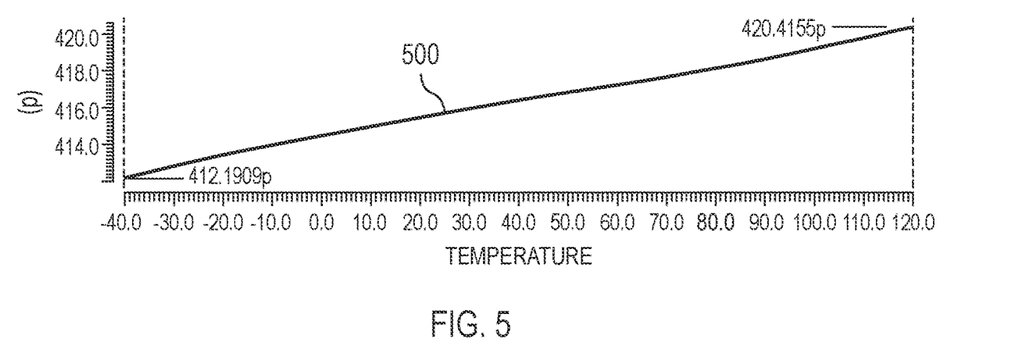
FIG. 5 illustrates an example plot of time delay versus temperature for an example DTC system 100 shown in FIG. 1 and FIG. 2 according to embodiments of the disclosure.

FIG. 5 illustrates an example plot 500 of time delay versus temperature for the DTC system 100 shown in FIG. 1 and FIG. 2 according to embodiments of the disclosure. The vertical axis represents a time delay in picoseconds (ps) and the horizontal axis represents temperature in Celsius (C). The temperature in the example plot 500 ranges from a low of negative forty (40.0) degrees C. to a high of one hundred and twenty (120) degrees C. As shown, the full-scale DTC delay range varies between 412 ps to 420 ps. Thus, the change in the total full-scale delay range across the temperature range is approximately eight (8) ps. Without temperature compensation, the change in the total full-scale delay range over the temperature range is greater. For example, in some instances, the change in the total full-scale delay range over the same temperature range can be approximately thirty-five (35) ps.

Figure 6:
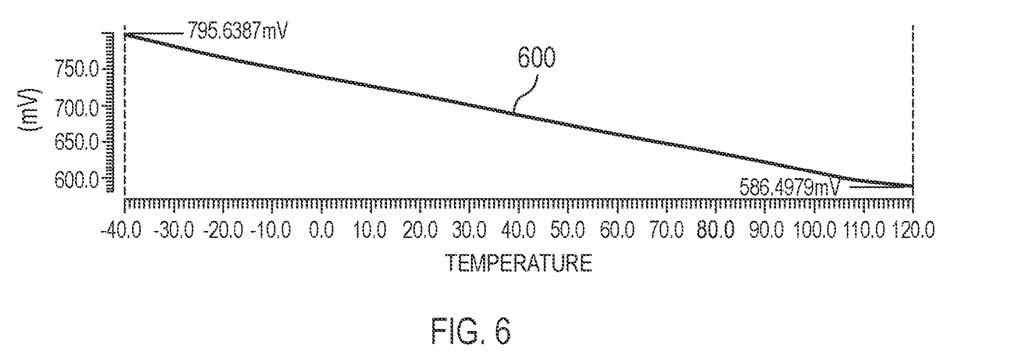
FIG. 6 illustrates an example plot of a supply voltage (Vdd) versus temperature for the example DTC system shown in FIG. 1 and FIG. 2 according to embodiments of the disclosure.

FIG. 6 illustrates an example plot 600 of a supply signal (Vdd) versus temperature for the example DTC system shown in FIG. 1 and FIG. 2 according to embodiments of the disclosure. The plot 600 represents the supply signal at the node 204 (FIG. 2). The vertical axis represents voltage in millivolts (mV) and the horizontal axis represents temperature in Celsius (C). The temperature in the example plot 600 ranges from a low of negative forty (40.0) degrees C. to a high of one hundred and twenty (120) degrees C. As shown, the supply signal (e.g., the voltage Vdd) decreases from approximately 795 mV to approximately 586 mV. Thus, the change in the supply signal across the temperature range is approximately 209 mV. The plot 600 has a constant negative slope with respect to the temperature.

Figure 7:
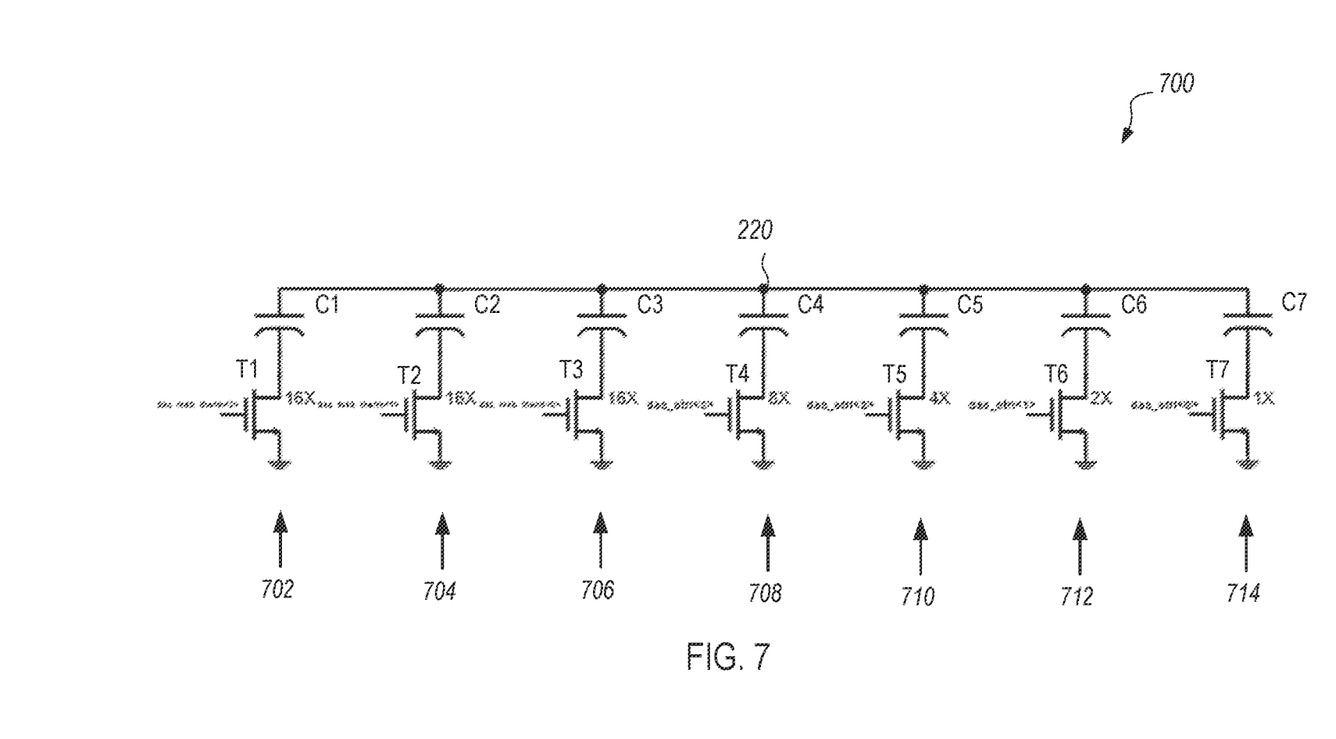
FIG. 7 illustrates a circuit diagram of an example programmable switch-capacitor array according to embodiments of the disclosure.

FIG. 7 illustrates a circuit diagram of an example programmable switch-capacitor array 700 according to embodiments of the disclosure. The programmable switch-capacitor array 700 can be used to implement the Cprog 222 in the DTC delay circuit 106 and in the DTC replica circuit 108 shown in FIG. 2. The programmable switch-capacitor array 700 is used for delay programming of the DTC delay circuit 106 and the DTC replica circuit 108. The programmable switch-capacitor array 700 is used to digitally control the DTC delay. The programmable switch-capacitor array 700 determines the delay steps for the full-scale delay range of the DTC system.

The example programmable switch-capacitor array 700 includes seven (7) circuit cells 702, 704, 706, 708, 710, 712, 714 operably connected in parallel between the node 220 and ground. Other embodiments can include one or more circuit cells. The circuit cell 702 includes a first terminal of a first capacitor C1 operably connected to the node 220. A second terminal of C1 is operably connected to a first terminal of a first n-type transistor T1. A second terminal of T1 is operably connected to ground.

The circuit cell 704 includes a first terminal of a second capacitor C2 operably connected to the node 220. A second terminal of C2 is operably connected to a first terminal of a second n-type transistor T2. A second terminal of T2 is operably connected to ground.

The circuit cell 706 includes a first terminal of a third capacitor C3 operably connected to the node 220. A second terminal of C3 is operably connected to a first terminal of a third n-type transistor T3. A second terminal of T3 is operably connected to ground.

The circuit cell 708 includes a first terminal of a fourth capacitor C4 operably connected to the node 220. A second terminal of C4 is operably connected to a first terminal of a fourth n-type transistor T4. A second terminal of T4 is operably connected to ground.

The circuit cell 710 includes a first terminal of a fifth capacitor C5 operably connected to the node 220. A second terminal of C5 is operably connected to a first terminal of a fifth n-type transistor T5. A second terminal of T5 is operably connected to ground.

The circuit cell 712 includes a first terminal of a sixth capacitor C6 operably connected to the node 220. A second terminal of C6 is operably connected to a first terminal of a sixth n-type transistor T6. A second terminal of T6 is operably connected to ground.

The circuit cell 714 includes a first terminal of a seventh capacitor C7 operably connected to the node 220. A second terminal of C7 is operably connected to a first terminal of a seventh n-type transistor T7. A second terminal of T7 is operably connected to ground. In a non-limiting nonexclusive example, the capacitance value of C1 is 155.2 femtofarads (fF), the capacitance value of C2 is 155.2 fF, the capacitance value of C3 is 155.2 fF, the capacitance value of C4 is 77.6 fF, the capacitance value of C5 is 38.8 fF, the capacitance value of C6 is 19.4 fF, and the capacitance value of C7 is 9.7 fF.

The capacitors C1-C7 represent one or more capacitors in respective circuit cells 704, 706, 708, 710, 712, 714. In a non-limiting nonexclusive example, the capacitors C1, C2, C3 each represent sixteen (16) capacitors (for a total of 48 capacitors). The capacitor C4 represents eight (8) capacitors. The capacitor C5 represents four (4) capacitors. The capacitor C6 represents two (2) capacitors. The capacitor C7 represents one (1) capacitor. Thus, in this example, the programmable switch-capacitor array 700 includes a total of sixty-three (63) capacitors. Other embodiments are not limited to this number of capacitors. The programmable switch-capacitor array 700 may include any number of capacitors.

The gates of the n-type transistors T4-T7 receive a bit in each control code that is output by the DTC control circuit 110 (FIG. 1). A last bit, or the least significant bit (LSB), of the control code is applied to the gate of T7. A second bit of the control code is applied to the gate of T6. A third bit of the control code is applied to the gate of T5. A fourth bit of the control code is applied to the gate of T4. For example, when the control code is a six-bit control word (bit positions 543210), the bit at bit position 3 is applied to the gate of T4, the bit at bit position 2 is applied to the gate of T5, the bit at bit position 1 is applied to the gate of T6, and the bit at bit position 0 (the LSB) is applied to the gate of T7.

The bit applied to the gate of T3, the bit applied to the gate of T2, and the bit applied to the gate of T1 are bits generated by a thermometer code circuit (e.g., thermometer code circuit 114 in FIG. 1). The MSB produced by the thermometer code circuit is applied to the gate of T1. The second MSB produced by the thermometer code circuit is applied to the gate of T2. The third MSB produced by the thermometer code circuit is applied to the gate of T3.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A digital-to-time converter (DTC), the DTC comprising:
   a bias circuit;
   a delay circuit operably connected to the bias circuit;
   a replica circuit operably connected to the bias circuit, wherein the bias circuit is operable to output a supply signal for the delay circuit and the replica circuit has a negative slope with respect to a signal level of the supply signal and temperature; and
   a low dropout voltage regulator (LDO) circuit operably connected between the bias circuit and the delay circuit and the replica circuit.

2. The DTC of claim 1, further comprising a control circuit operably connected to the delay circuit and the replica circuit, the control circuit operable to provide control codes to the delay circuit and the replica circuit.

3. The DTC of claim 1, wherein
   the supply signal is input into the delay circuit and into the replica circuit; and
   the delay circuit is configured to generate a time delay for an input clock signal based on a control code that adjusts the time delay.

4. The DTC of claim 3, wherein:
   the replica circuit is configured to receive a complementary control code that is complementary to the control code; and
   the delay circuit comprises a programmable capacitor array having a capacitance, wherein the complementary control code is applied to the replica circuit so that the capacitance is so that a constant capacitive load is presented to the LDO circuit.

5. The DTC of claim 4, further comprising a control circuit configured to generate the control code, wherein one or more bits in the control code adjust the time delay.

6. The DTC of claim 5, wherein the control circuit comprises a thermometer code circuit configured to receive the one or more bits in a control word and convert the one or more bits into one or more thermometer codes.

7. The DTC of claim 1, wherein the replica circuit is a replica of the delay circuit.

8. The DTC of claim 7, wherein the replica circuit includes a same components and layout of the components as in the delay circuit.

9. The DTC of claim 1, wherein the delay circuit comprises a plurality of inverters operably connected in series.

10. The DTC of claim 9, wherein each of the plurality of inverters comprises
    a p-type transistor;
    a n-type transistor; and
    the p-type transistor is connected in series with the n-type transistor.

11. The DTC of claim 9, further comprising a programmable resistor connected between an output of one of the inverters and a terminal of the n-type transistor of the one of the inverters.

12. The DTC of claim 1, wherein the bias circuit includes a first circuit path, a second circuit path, and a third circuit path operably connected in parallel between an input node of the bias circuit and ground.

13. The DTC of claim 12, wherein the first circuit path comprises:
    a first p-type transistor having a first terminal operably connected to the input node and a second terminal operably connected to a first node;
    a first resistor operably connected between the first node and a second node;
    a first n-type transistor having a third terminal operably connected to the second node and a fourth terminal; and
    a second n-type transistor having a fifth terminal operably connected to ground.

14. The DTC of claim 13, wherein the second circuit path comprises:
    a third p-type transistor having a sixth terminal operably connected to the input node and a seventh terminal operably connected to a third node;
    a second resistor operably connected between the third node and a fourth node;
    a third n-type transistor having an eighth terminal operably connected to the fourth node and a ninth terminal; and
    a second n-type transistor having a tenth terminal operably connected to ground.

15. The DTC of claim 14, wherein the third circuit path comprises a fourth p-type transistor operably connected to an input node and the fourth terminal of the third p-type transistor, wherein the fourth terminal is operably connected to an output node.

16. The DTC of claim 1 wherein a temperature dependency of a DTC delay is compensated for in part by adjusting an input slope dependent delay of an inverter.

17. The DTC of claim 1, wherein:
    the delay circuit is configured to receive a control code;
    the replica circuit is configured to receive a complementary control code that is complementary to the control code;
    a programmable switch-capacitor array is configured for delay programming of the delay circuit and the replica circuit; and
    the delay circuit comprises a plurality of inverters operably connected in series.

18. The DTC of claim 17, wherein the programmable switch-capacitor array comprises a plurality of circuit cells operably connected in parallel between one of the plurality of inverters and ground.

19. The DTC of claim 18, wherein each of the circuit cells comprises a capacitor and a transistor coupled in series between the one of the plurality of inverters and ground.

* * * * *

UNITED STATES PATENT AND TRADEMARK OFFICE
CERTIFICATE OF CORRECTION

| | | |
|---|---|---|
| PATENT NO. | : 12,422,783 B2 | Page 1 of 1 |
| APPLICATION NO. | : 18/207933 | |
| DATED | : September 23, 2025 | |
| INVENTOR(S) | : Erdogan Ozgur Ates | |

It is certified that error appears in the above-identified patent and that said Letters Patent is hereby corrected as shown below:

In the Specification

In Column 4, at Line 55, change "inverters 212A, 2128" to read --inverters 212A, 212B--

In Column 4, at Lines 60 and 61, change "inverter 2128" to read --inverter 212B--

Signed and Sealed this
Fourth Day of November, 2025

John A. Squires
*Director of the United States Patent and Trademark Office*